(12) United States Patent
Agnello et al.

(10) Patent No.: US 9,688,570 B2
(45) Date of Patent: Jun. 27, 2017

(54) LAYERED TRANSPARENT CONDUCTIVE OXIDE THIN FILMS

(71) Applicant: CORNING INCORPORATED, Corning, NY (US)

(72) Inventors: Gabriel Pierce Agnello, Corning, NY (US); Indrajit Dutta, Horseheads, NY (US); Jean-Francois Oudard, Webster, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 14/773,518

(22) PCT Filed: Mar. 4, 2014

(86) PCT No.: PCT/US2014/020095
§ 371 (c)(1),
(2) Date: Sep. 8, 2015

(87) PCT Pub. No.: WO2014/137967
PCT Pub. Date: Sep. 12, 2014

(65) Prior Publication Data
US 2016/0016848 A1     Jan. 21, 2016

Related U.S. Application Data

(60) Provisional application No. 61/774,874, filed on Mar. 8, 2013.

(51) Int. Cl.
*B32B 15/04* (2006.01)
*B32B 17/06* (2006.01)
(Continued)

(52) U.S. Cl.
CPC .......... *C03C 17/245* (2013.01); *C03C 17/007* (2013.01); *C03C 17/2453* (2013.01);
(Continued)

(58) Field of Classification Search
USPC ....... 428/426, 428, 432, 434, 688, 689, 697, 428/701, 702
See application file for complete search history.

(56) References Cited

U.S. PATENT DOCUMENTS

| 6,797,388 B1 * | 9/2004 | Szanyi ................. C03C 17/3417 427/164 |
| 2009/0194155 A1 | 8/2009 | den Boer et al. |

(Continued)

FOREIGN PATENT DOCUMENTS

| WO | 0055102 | 9/2000 |
| WO | 2009099517 | 8/2009 |

(Continued)

OTHER PUBLICATIONS

WO2011121922 English machine translation, 2016.*

(Continued)

*Primary Examiner* — Lauren R Colgan (57) ABSTRACT

Transparent conductive oxide thin films having a plurality of layers with voids located at each interface. Smooth TCO surfaces with no post growth processing and a largely tunable haze value. Methods of making include applying multiple layers of a conductive oxide onto a surface of a substrate, and interrupting the application between the multiple layers to form a plurality of voids at the interfaces.

17 Claims, 5 Drawing Sheets

(51) Int. Cl.
*C03C 17/245* (2006.01)
*C03C 17/00* (2006.01)
*C03C 17/34* (2006.01)
*C23C 16/40* (2006.01)
*C23C 16/453* (2006.01)
*C23C 16/52* (2006.01)

(52) U.S. Cl.
CPC .......... *C03C 17/3417* (2013.01); *C23C 16/40* (2013.01); *C23C 16/453* (2013.01); *C23C 16/52* (2013.01); *C03C 2217/211* (2013.01); *C03C 2217/241* (2013.01); *C03C 2217/45* (2013.01); *C03C 2217/94* (2013.01); *C03C 2218/1525* (2013.01); *C03C 2218/30* (2013.01); *C03C 2218/345* (2013.01)

(56) References Cited

U.S. PATENT DOCUMENTS

| | | |
|---|---|---|
| 2011/0025941 A1 | 2/2011 | Nakagawa |
| 2016/0087196 A1* | 3/2016 | Rupp ...................... H01L 45/04 257/4 |

FOREIGN PATENT DOCUMENTS

| | | |
|---|---|---|
| WO | 2010022530 | 3/2010 |
| WO | 2011121922 | 10/2011 |
| WO | 2012136919 | 10/2012 |

OTHER PUBLICATIONS

Agashe et al.; "Physical properties of highly oriented spray-deposited fluorine-doped tin dioxide films as transparent conductor"; Solar Energy Materials & Solar Cells 93 (2009) 1256-1262.

Dahou et al.; "Influence of anode roughness and buffer layer nature on organic solar cells performance"; Thin Solid Films, 518 (2010) 6117-6122.

Kim et al.; "Fabrication of rough Al doped ZnO films deposited by low pressure chemical vapor deposition for high efficiency thin film solar cells"; Current Applied Physics 10 (2010) S459-S462.

Krc et al.; "Potential of thin-film silicon solar cells by using high haze TCO superstrates"; Thin Solid Films 518 (2010) 3054-3058.

Ren et al.; "Fabrication of textured SnO2:F thin films by spray pyrolysis"; Applied Surface Science 258 (2011) 914-918.

Wang et al.; "Large-area SnO2:F thin films by offline APCVD"; Materials Research Bulletin 46 (2011) 1262-1265.

\* cited by examiner

LAYERED TRANSPARENT CONDUCTIVE OXIDE THIN FILMS

CROSS-REFERENCE TO RELATED APPLICATIONS

This application claims the benefit of priority to Patent Application No. PCT/US14/20095, filed on Mar. 4, 2014, which claims the benefit of priority to Patent Application No. 61/774,874, filed on Mar. 8, 2013, the content of which is relied upon and incorporated herein by reference in its entirety.

FIELD

The present disclosure relates to transparent conductive oxide (TCO) thin films and more particularly to layered TCO thin films useful in, for example, photovoltaic devices.

TECHNICAL BACKGROUND

The current state of the art for the enhancement of haze in Si Tandem systems is based upon surface engineering approaches to texturize either the TCO surface and/or the glass surface prior to TCO deposition. By creating large faceted surface features on the TCO, incoming light will geometrically scatter into the underlying semiconductor. This leads to increased light trapping, overcoming the poor absorption coefficient in Si. Because TCO growth is conformal in nature, the creation of texture on the glass surface can lead to the same scattering phenomena, therefore increasing the level of light trapping in the Si.

In CdTe systems, a low haze TCO is generally achieved through the smoothing of the film surface, either by post growth polishing and/or deposition process modifications. Both of these paths add additional process complexity, not to mention cost in the case of post polishing.

It would be advantageous to have a smooth TCO surface with no post growth processing and a largely tunable haze value.

SUMMARY

Haze, or diffuse optical scattering, is an example of a performance specification for transparent conducting oxide electrodes in thin film photovoltaic technology. Depending on the specific technology, for example, cadmium telluride (CdTe) or silicon tandem (Si tandem), the haze value can be either low (<2%) or high (>10%), respectively. This disclosure describes the modification of TCO haze for exemplary applications, for example, where a high level of forward scattering is advantageous (Si tandem) and where a smooth surface is desirable (CdTe).

Embodiments described herein may provide one or more of the following advantages: haze enhancement without any ex situ process steps while maintaining high electrical and optical performance; controllability of TCO haze largely independent of major process variation; lower potential manufacturing costs because of less equipment usage/maintenance; higher throughput due to a decrease in process complexity; elimination of potential Si growth issues arising because of ex situ texturing process; technology is substrate independent; easy application to fields where a TCO with a smooth surface is desired, such as CdTe PV.

One embodiment is an article comprising a transparent conductive oxide thin film having a plurality of layers, an interface between each layer, a plurality of voids located at each interface, wherein the film is disposed on a substrate.

Another embodiment is a method of making a transparent conductive oxide having a plurality of layers, the method comprising providing a substrate having at least one surface, applying a first layer of a conductive oxide onto the at least one surface, applying a second layer of the conductive oxide onto the first layer, and interrupting the applying between the first layer and the second layer, thereby forming a plurality of voids at an interface between the first layer and the second layer.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiment(s), and together with the description serve to explain principles and operation of the various embodiments.

DETAILED DESCRIPTION

Reference will now be made in detail to the present preferred embodiment(s), examples of which are illustrated in the accompanying drawings. Whenever possible, the same reference numerals will be used throughout the drawings to refer to the same or like parts.

As used herein, the term "substrate" can be used to describe either a substrate or a superstrate depending on the configuration of the photovoltaic cell. For example, the substrate is a superstrate, if when assembled into a photovoltaic cell, it is on the light incident side of a photovoltaic cell. The superstrate can provide protection for the photovoltaic materials from impact and environmental degradation while allowing transmission of the appropriate wavelengths of the solar spectrum. Further, multiple photovoltaic cells can be arranged into a photovoltaic module. Photovoltaic device can describe either a cell, a module, or both.

Where a range of numerical values is recited herein, comprising upper and lower values, unless otherwise stated in specific circumstances, the range is intended to include the endpoints thereof, and all integers and fractions within the range. It is not intended that the scope of the invention be limited to the specific values recited when defining a range. Further, when an amount, concentration, or other value or parameter is given as a range, one or more preferred ranges or a list of upper preferable values and lower preferable values, this is to be understood as specifically disclosing all ranges formed from any pair of any upper range limit or preferred value and any lower range limit or preferred value, regardless of whether such pairs are separately disclosed. Finally, when the term "about" is used in describing a value or an end-point of a range, the disclosure should be understood to include the specific value or endpoint referred to.

As used herein, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. In general, an amount, size, formulation, parameter or other quantity or characteristic is "about" or "approximate" whether or not expressly stated to be such.

The term "or", as used herein, is inclusive; more specifically, the phrase "A or B" means "A, B, or both A and B". Exclusive "or" is designated herein by terms such as "either A or B" and "one of A or B", for example.

The indefinite articles "a" and "an" are employed to describe elements and components of the invention. The use of these articles means that one or at least one of these elements or components is present. Although these articles are conventionally employed to signify that the modified noun is a singular noun, as used herein the articles "a" and "an" also include the plural, unless otherwise stated in specific instances. Similarly, the definite article "the", as used herein, also signifies that the modified noun may be singular or plural, again unless otherwise stated in specific instances.

For the purposes of describing the embodiments, it is noted that reference herein to a variable being a "function" of a parameter or another variable is not intended to denote that the variable is exclusively a function of the listed parameter or variable. Rather, reference herein to a variable that is a "function" of a listed parameter is intended to be open ended such that the variable may be a function of a single parameter or a plurality of parameters.

It is noted that terms like "preferably," "commonly," and "typically," when utilized herein, are not utilized to limit the scope of the claimed invention or to imply that certain features are critical, essential, or even important to the structure or function of the claimed invention. Rather, these terms are merely intended to identify particular aspects of an embodiment of the present disclosure or to emphasize alternative or additional features that may or may not be utilized in a particular embodiment of the present disclosure.

It is noted that one or more of the claims may utilize the term "wherein" as a transitional phrase. For the purposes of defining the present invention, it is noted that this term is introduced in the claims as an open-ended transitional phrase that is used to introduce a recitation of a series of characteristics of the structure and should be interpreted in like manner as the more commonly used open-ended preamble term "comprising."

One embodiment is an article comprising a transparent conductive oxide thin film having a plurality of layers, an interface between each layer, a plurality of voids located at each interface, wherein the film is disposed on a substrate.

Another embodiment is a method of making a transparent conductive oxide having a plurality of layers, the method comprising providing a substrate having at least one surface, applying a first layer of a conductive oxide onto the at least one surface, applying a second layer of the conductive oxide onto the first layer, and interrupting the applying between the first layer and the second layer, thereby forming a plurality of voids at an interface between the first layer and the second layer.

Disclosed herein are methods to increase forward scattering in TCO films while minimizing the need for modification of the film and/or glass surfaces. Highly scattering TCO stacks produced using these techniques also maintain high levels of electrical and optical performance which are necessary for application. The proposed approaches achieve haze modification through process changes that neither increase manufacturing costs nor process complexities that could possibly lead to poor throughput.

APCVD is the most commonly used method for TCO manufacturing because of its relative simplicity and low operating costs. This technology has successfully been adapted to a large scale offline process; where high performance fluorine doped tin oxide (FTO) films have been fabricated on Corning Incorporated fusion-formed PV glasses. Two approaches for the enhancement of haze in TCO thin films have been developed. Neither approach involves glass/film surface modification.

The first approach achieves enhanced haze through a multi-step deposition process where the glass traverses the deposition zone numerous times, producing an FTO film comprised of many "sublayers". Transmission Electron Microscopy (TEM) analysis has shown that these growth interruptions cause nano-scale interfacial layers to form that consist largely of voids. These regions contribute to a measured increase in haze. By adjusting process chemistry, this process can be repeated (or eliminated) as many times as desired to obtain a target haze value.

The second approach relies on the alteration of FTO crystal orientation between "sublayers" to enhance haze. By significantly changing the orientation from one FTO sublayer to the next, void formation at the interface can be intentionally incorporated into the film structure leading to an increase in measured haze.

Using these methods, the amount of forward scattering can be tailored specifically to the target technology. For application in Si tandem, these engineering techniques can be relied on heavily to increase the level of scattering without modifying the glass and/or film surface. On the other hand, CdTe PV technology requires a low haze TCO. In this case, module manufacturers are less concerned with the suppression of optical scatter than they are with the minimization of the electrode surface roughness. This is primarily because of the difficulty involved with growth of high quality CdTe solar absorbers on top of the TCO. The presently discussed engineering methods have little or no affect on the TCO surface roughness, so films grown in this way are also useful in the fabrication of CdTe based devices, even though their measured haze values are high. Concurrently, if optical scattering is determined to be an issue, high performance TCO films with the same minimal surface roughness can be produced by eliminating the added process steps. These approaches allow for the controllable, theoretically limitless enhancement or suppression of haze in the TCO structure with no additional film or glass surface modification.

Figure 1:
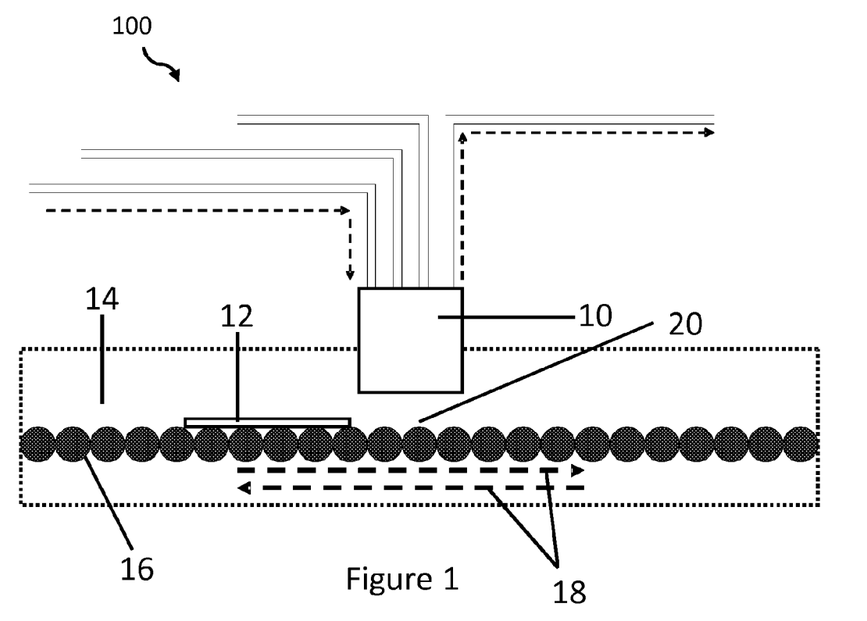
FIG. 1 is a schematic of the cross-section of an exemplary Atmospheric Pressure Chemical Vapor Deposition (AP-CVD) reactor used for the deposition of TCO, for example, fluorine-doped tin oxide (FTO) films.

FIG. 1 is a schematic of features 100 of an APCVD reactor used to deposit TCO thin films on substrates, for example, glass substrates such as fusion formed substrates (manufactured by Corning Incorporated). The gas injection system 10 is surrounded on either side by zones with quartz tube heating elements. The glass substrate 12 enters the first heating zone 14 on the conveyor 16 where the glass substrate oscillates, indicated by arrows 18, for a defined amount of time while it heats to a predetermined process temperature. The injection system activates after a user defined soak time, and the process chemistry begins to flow into the deposition zone 20. The glass substrate traverses the deposition zone where, for example, an FTO film is deposited through the following reaction:

$$SnCl_4 + 2H_2O + F_2 \rightarrow SnO_2{:}F + 4HCl$$

Figure 2A:
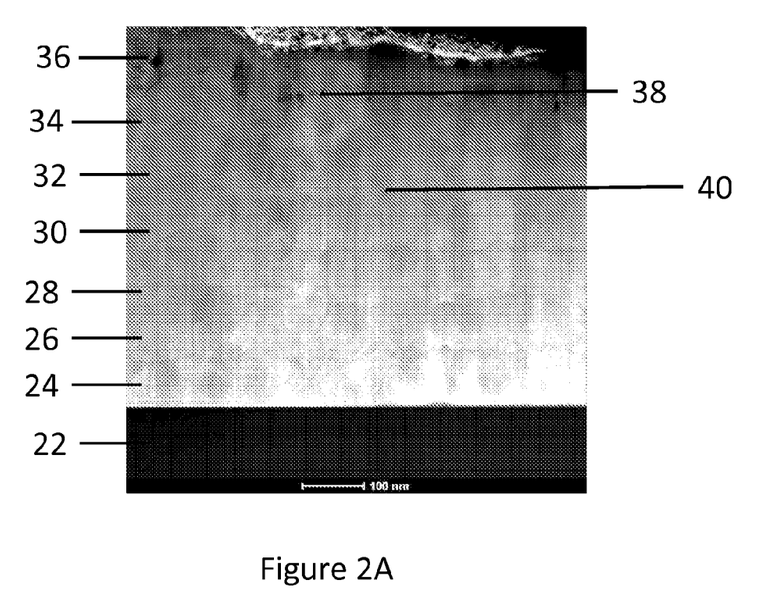
FIG. 2A is a High Angle Annular Dark Field (HAADF) transition electron microscope (TEM) micrograph showing a 7 pass layered TCO.

FIG. 2A is a High Angle Annular Dark Field (HAADF) transition electron microscope (TEM) micrograph showing a 7 layered (24, 26, 28, 30, 32, 34, 36) TCO on a glass substrate 22. Interfacial voids 38 and 40, in FIG. 2A, between layers are clearly visible.

Figure 2B:
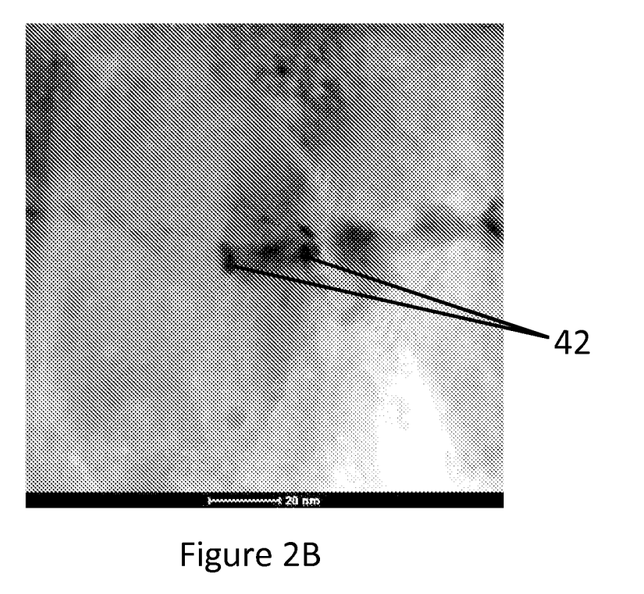
FIG. 2B is a magnified segment of the interface between passes 6 and 7 of the layered TCO shown in FIG. 2A.

The thickness of the deposited film can depend on the concentration of precursor allowed to enter the deposition zone and the speed of the conveyor. A film of ~500 nm can be made either in 1 pass or in several depending on how the recipe is defined. The crystal orientation of the deposited film, for example, FTO can be altered through process chemistry variations and/or the speed of the conveyor. Growth interruption between passes under the injector system results in discrete several nanometer thick interfacial layers that are comprised largely of voids. TEM imaging clearly shows the formation of these voids (individual diameters~0.5-3 nm) between sublayers in the structure (FIGS. 2A-C).

Interfacial voids present between passes 1-6 in FIG. 2A can be caused by growth interruption; the process recipe was not altered, leading to ideal coupling of the layers' crystal structures. As a result, the voids found at the interface are extremely small (radius~<1 nm).

Figure 2C:
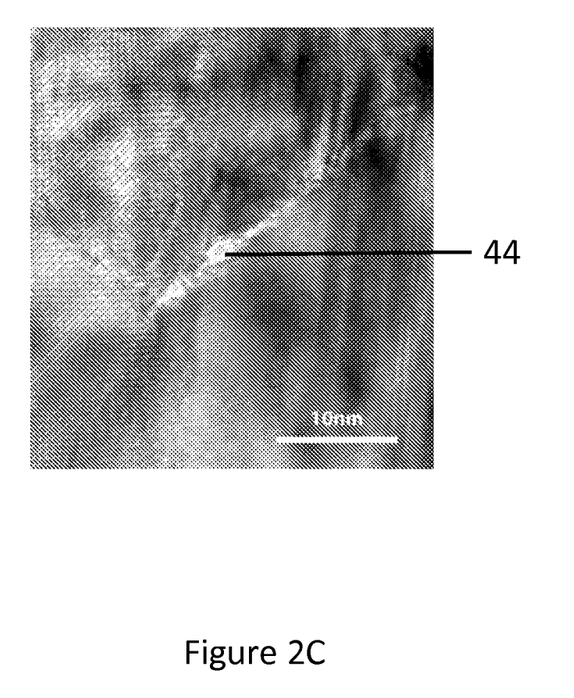
FIG. 2C is a Bright Field (BF) High Resolution (HR) TEM image of the interface between passes 3 and 4 of the layered TCO shown in FIG. 2A.

FIG. 2C is a Bright Field (BF) High Resolution (HR) TEM image of the interface between passes 3 and 4, 28 and 30 in FIG. 2A. Interfacial voids 44 appear white, because of the difference in imaging conditions.

Figure 4:
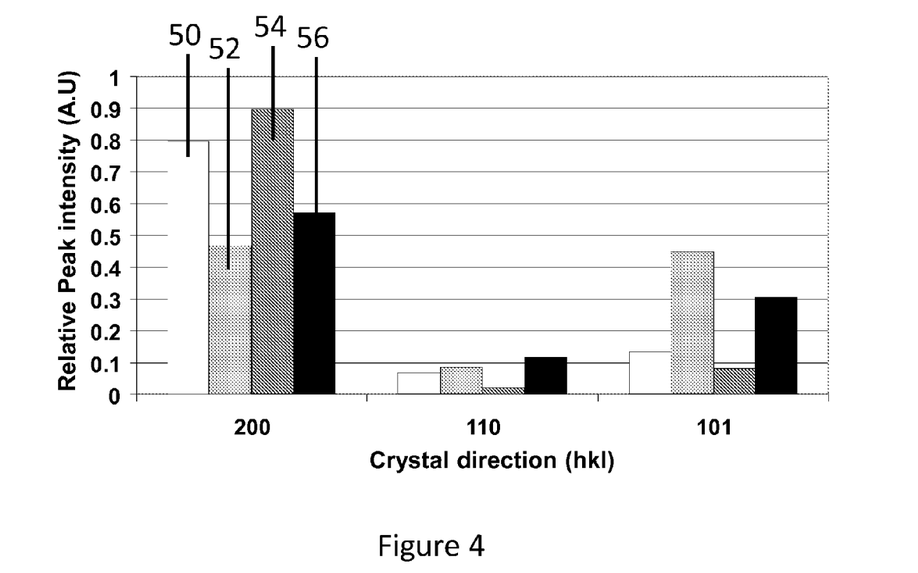
FIG. 4 is a graph showing x-ray diffraction (XRD) data showing changes in FTO crystal orientation as functions of process parameter variations.

Void formation can also be enhanced through the alteration of the films' crystal orientation. By intentionally mismatching a layer's crystal structure to that found below it, larger voids are formed due to the higher induced stresses at the interface in addition to those formed from growth interruption. Crystal orientation can be controllably altered through simple process modifications to precursor ratios and/or conveyor line speeds; this results in engineered films of either highly preferential or random orientation (FIG. 4). FIG. 4 is a graph showing x-ray diffraction (XRD) data showing changes in FTO crystal orientation as functions of process parameter variations, white bars 50 show x-ray diffraction data of layered TCOs made using low precursor ratios and low conveyor line speed, light gray bars 52 show x-ray diffraction data of layered TCOs made using low precursor ratios and high conveyor line speed, dark gray bars 54 show x-ray diffraction data of layered TCOs made using high precursor ratios and low conveyor line speed, black bars 56 show x-ray diffraction data of layered TCOs made using high precursor ratios and high conveyor line speed.

FIG. 2B is a magnified segment of the interface between passes 6 and 7 (34 and 36, respectively) of the layered TCO shown in FIG. 2A. Larger voids 42 observed at an intentionally mismatched interface (passes 6 and 7) are shown in FIG. 2B.

Figure 3:
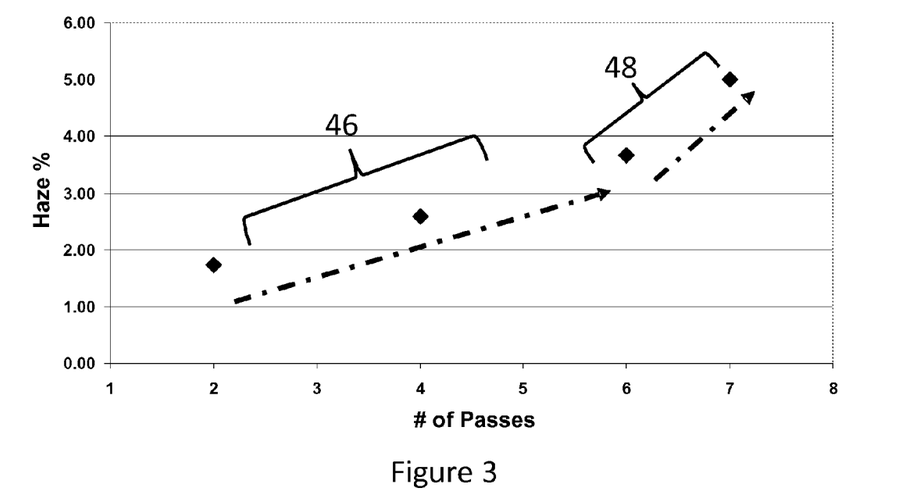
FIG. 3 is a graph showing haze enhancement as a function of number of passes.

FIG. 3 is a graph showing haze enhancement as a function of number of passes. Haze measurements made on ~500 nm thick FTO films grown with variable passes are shown in FIG. 3. For the 2-6 pass films, the process recipe was held constant; therefore the only significant alteration to the film structure was because of growth interruption. Haze increased linearly with number of passes 46 with an approximate increase of ~0.5% per pass. The final sub-layer in the 7 pass film was formed using different process chemistry and flows leading to an altered crystal structure relative to the underlying layers. The consequent mismatch leads to the formation of larger voids at the interface and the larger (~1.4%) increase in haze enhancement 48.

Figure 5:
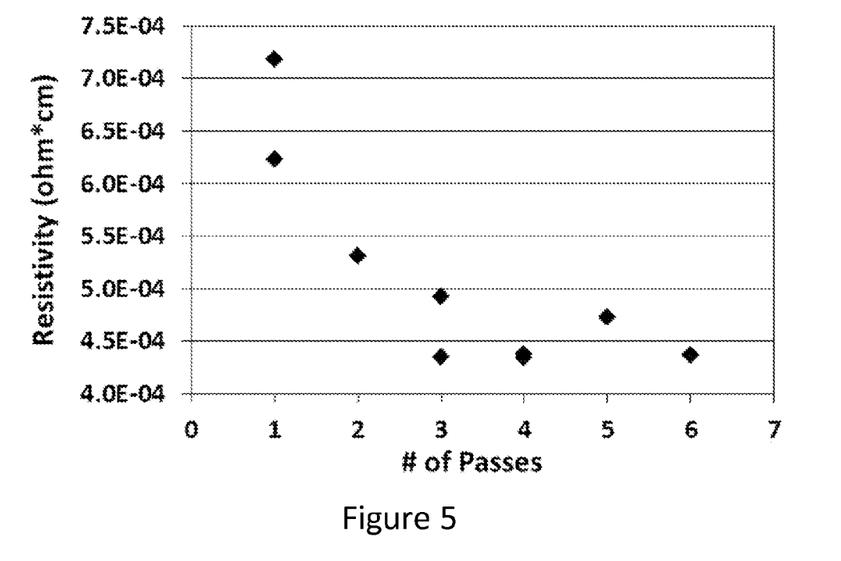
FIG. 5 is a graph showing TCO resistivity as a function of number of passes under the gas injection system.
Figure 6:
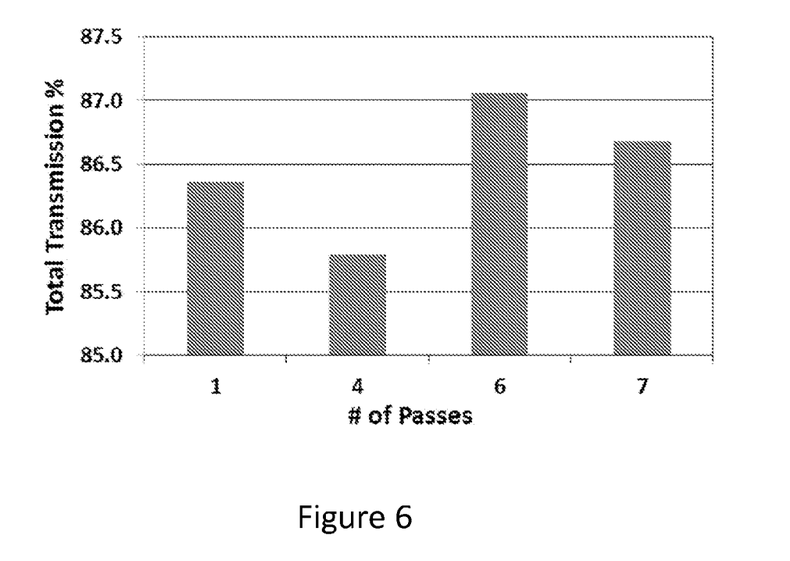
FIG. 6 is a graph showing TCO total transmission (specular+diffuse) as a function of number of passes underneath the injection system.
Figure 7:
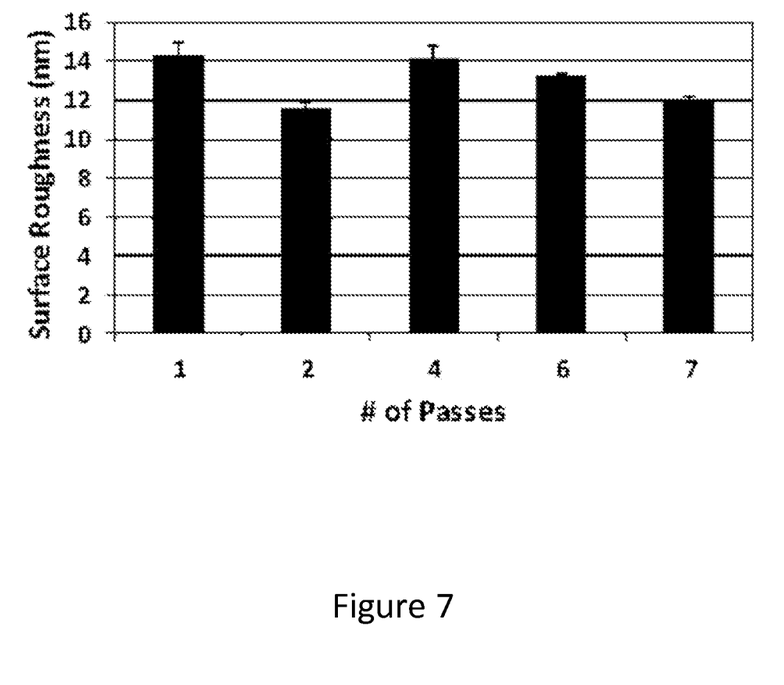
FIG. 7 is a graph showing TCO surface roughness as a function of number of passes under the gas injection system.

Experimental observation of the haze enhancement increase with interfacial void size has been verified independently through Rayleigh scattering calculations. TCO structures with enhanced haze produced under the conditions described maintain consistently high electrical (FIG. 5) and optical performance (FIG. 6) as well as low surface roughness (FIG. 7). FIG. 5 is a graph showing TCO resistivity as a function of number of passes under the gas injection system. TCO produced with higher (3-6) passes exhibits resistivity<$10^{-5}$ ohm*cm. If 1 or 2 pass TCO is desired, the process can be modified to achieve lower resistivities. FIG. 6 is a graph showing TCO total transmission (specular+diffuse) as a function of number of passes underneath the injection system. Variations in measured values are primarily due to small differences in film thickness.

It will be apparent to those skilled in the art that various modifications and variations can be made without departing from the spirit or scope of the invention.

What is claimed is:

1. An article comprising:
   a transparent substrate;
   a transparent conductive oxide film comprising fluorine-doped tin oxide disposed on the substrate;
   the transparent conductive oxide film comprising a plurality of two or more layers adjacent to and in direct contact with one another, forming an interface between the layers;
   one or more voids located at the interface, the one or more voids having individual diameters of from about 0.5 nm to 3 nm;
   wherein the plurality of two or more layers each comprise a crystal structure, and wherein the crystal structures are mismatched due to interruptions of the crystal structure at the interface or intentional mismatch of the crystal orientations in each layer; and
   an optional additional transparent conductive oxide layer disposed on the transparent conductive oxide film, wherein the additional transparent conductive oxide layer has an altered crystal structure relative to the two or more layers.

2. The article according to claim 1, wherein the substrate is a glass.

3. The article according to claim 1, wherein the transparent conductive oxide film is directly in contact with the substrate.

4. The article according to claim 1, wherein the plurality of two or more layers comprises 3 to 7 layers.

5. The article of claim 1, wherein the article has a total haze based on the transparent substrate, the transparent conductive oxide film, and the optional additional transparent conductive oxide layer, the total haze being from about 2% to about 5%.

6. The article of claim 1, wherein the article has a resistivity based on the transparent conductive oxide film and the optional additional transparent conductive oxide layer, the resistivity being from about $7.5 \times 10^{-4}$ to about $4.0 \times 10^{-4}$ ohm*cm.

7. The article of claim 1, wherein the article has a total transmission based on the transparent substrate, the transparent conductive oxide film, and the optional additional transparent conductive oxide layer, the total transmission being from about 85% to about 87.5%.

8. The article of claim 1, wherein the article has a surface roughness based on the transparent substrate, the transparent conductive oxide film, and the optional additional transparent conductive oxide layer, the surface roughness being from about 10 nm to about 16 nm.

9. A method of making an article comprising a transparent substrate and a transparent conductive oxide film comprising a plurality of two or more layers adjacent to and in direct contact with one another, the method comprising:
   providing a substrate having at least one surface;
   applying a first layer of a conductive oxide onto the at least one surface, the first layer having a first crystal structure;
   applying a second layer of a conductive oxide onto the first layer, the second layer having a second crystal structure, wherein the first and second layers of conductive oxides form at least part of the transparent conductive oxide film, the transparent oxide film comprising a fluorine-doped tin oxide;
   interrupting the applying between the first layer and the second layer such that the first and second crystal structures are mismatched, thereby forming an interface between the first layer and the second layer and at the interface, one or more voids having individual diameters of from about 0.5 nm to 3 nm; and
   optionally applying an additional transparent conductive oxide layer on the transparent conductive oxide film, wherein the additional transparent conductive oxide layer has an altered crystal structure relative to the two or more layers.

10. The method according to claim 9, wherein the interrupting comprises stopping the applying between the first layer and the second layer.

11. The method according to claim 9, wherein the interrupting comprises changing percursor material between the first layer and the second layer.

12. The method according to claim 9, wherein the interrupting comprises changing speed of the applying between the first layer and the second layer.

13. The method according to claim 9, wherein the interrupting comprises changing percursor material and changing speed of the applying between the first layer and the second layer.

14. The method according to claim 9, wherein the interrupting comprises changing percursor concentration between the first layer and the second layer.

15. The method according to claim 9, further comprising repeating the applying to form subsequent layers.

16. The method according to claim 9, wherein the interrupting comprises changing percursor concentration and changing speed of the applying between the first layer and the second layer.

17. The method according to claim 9, wherein the interrupting comprises changing percursor concentration and changing speed of the applying between the first layer and the second layer.

* * * * *